United States Patent
Zamir et al.

(10) Patent No.: US 11,469,741 B1
(45) Date of Patent: Oct. 11, 2022

(54) CIRCUIT FOR IMPROVING EDGE-RATES IN VOLTAGE-MODE TRANSMITTERS

(71) Applicant: Synopsys, Inc., Mountain View, CA (US)

(72) Inventors: Eliyahu Dan Zamir, Mississauga (CA); Michael William Kawa Lynch, Mississauga (CA); Davit Petrosyan, Mississauga (CA)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 17/004,913

(22) Filed: Aug. 27, 2020

Related U.S. Application Data

(60) Provisional application No. 62/893,416, filed on Aug. 29, 2019.

(51) Int. Cl.
| | | |
|---|---|---|
| *H03K 3/012* | (2006.01) | |
| *H03K 3/037* | (2006.01) | |
| *H04L 25/02* | (2006.01) | |
| *H04B 1/04* | (2006.01) | |
| *H03K 19/21* | (2006.01) | |

(52) U.S. Cl.
CPC ............ *H03K 3/012* (2013.01); *H03K 3/037* (2013.01); *H03K 19/21* (2013.01); *H04B 1/04* (2013.01); *H04L 25/029* (2013.01)

(58) Field of Classification Search
CPC ........ G11C 19/00; G11C 19/28; H03K 19/00; H03K 19/21; H03K 3/00; H03K 3/012; H03K 3/013; H03K 3/037; H03K 3/0375; H03K 3/286; H04B 1/00; H04B 1/04; H04L 25/00; H04L 25/029
USPC .......................................................... 327/225
See application file for complete search history.

(56) References Cited

U.S. PATENT DOCUMENTS

| | | | |
|---|---|---|---|
| 9,496,872 B1* | 11/2016 | Kuenemund | H03K 19/003 |
| 2018/0152193 A1* | 5/2018 | Goel | H03L 7/091 |
| 2019/0319621 A1* | 10/2019 | Kim | G11C 29/50008 |

OTHER PUBLICATIONS

Abhayagunawardhana, C. et al., "PCI Express® Base Specification Revision 5.0 Version 0,7," PCI-SIG®, Mar. 31, 2018, 2,074 pages.

* cited by examiner

*Primary Examiner* — Menatoallah Youssef
*Assistant Examiner* — Dave Mattison
(74) *Attorney, Agent, or Firm* — Fenwick & West LLP

(57) ABSTRACT

The driver circuit includes a pull-up network having a first pull-up transistor controlled by a data signal, a second pull-up transistor coupled between the first pull-up transistor and a first power supply voltage, and a third pull-up transistor coupled in parallel with the second pull-up transistor. The third pull-up transistor is configured to turn on for at least one clock cycle responsive to a change in the logic level of the data signal being detected.

19 Claims, 3 Drawing Sheets

US 11,469,741 B1

CIRCUIT FOR IMPROVING EDGE-RATES IN VOLTAGE-MODE TRANSMITTERS

CROSS REFERENCE TO RELATED APPLICATIONS

This application claims the benefit of U.S. Provisional Application No. 62/893,416, filed Aug. 29, 2019, which is incorporated by reference in its entirety.

FIELD OF THE DISCLOSURE

The present disclosure relates to a communication circuitry and more specifically to improving the performance of voltage-mode transmitters in the presence of excessive capacitive loading.

BACKGROUND

Voltage-mode transmitters are used in high-speed communication systems, as they offer relatively low power and high performing solution relative to some other transmitter options. Generally, the output impedance of any high-speed transmitter is designed to match the characteristic impedance of the channel it is attempting to drive. As such, the transmitter's impedance is specified according to its application, and a circuit designer has little flexibility in selecting the transmitter's output impedance.

SUMMARY

A driver circuit may improve the signal quality of data transmission by reducing the rise-time and the fall-time of the transmitted stream. The driver circuit temporarily reduces the output impedance when an impending data transmission is detected. Conversely, when the output data stream is static, the driver circuit returns to having a predetermined output impedance.

The driver circuit includes a pull-up network having a first pull-up transistor controlled by a data signal, a second pull-up transistor coupled between the first pull-up transistor and a first power supply voltage, and a third pull-up transistor coupled in parallel with the second pull-up transistor. The third pull-up transistor is configured to turn on for at least one clock cycle responsive to a change in the logic level of the data signal being detected.

In some embodiments, the driver circuit further includes a pull-down network having a first pull-down transistor controlled by the data signal, a second pull-down transistor coupled between the first pull-down transistor and a second power supply voltage, and a third pull-down transistor coupled in parallel with the second pull-down transistor. The third pull-down transistor is configured to turn on for at least one clock cycle responsive to the change in logic level in the data signal being detected.

The driver circuit further includes a control circuit for generating a signal for controlling the third pull-up transistor and the third pull-down transistor. The control circuit includes a flip-flop receiving the data signal, and a logic gate receiving as an input the data signal and the output of the flip-flop. The logic gate is configured to generate an output signal having a first logic level in response to the data signal and the output of the flip-flop having the same logic level, and a second logic level in response to the data signal and the output of the flip-flop having a different logic level.

BRIEF DESCRIPTION OF THE DRAWINGS

The teachings of the embodiments can be readily understood by considering the following detailed description in conjunction with the accompanying drawings.

DETAILED DESCRIPTION OF EMBODIMENTS

The Figures (FIG.) and the following description relate to preferred embodiments by way of illustration only. It should be noted that from the following discussion, alternative embodiments of the structures and methods disclosed herein will be readily recognized as viable alternatives that may be employed without departing from the principles of the embodiments.

Reference will now be made in detail to several embodiments, examples of which are illustrated in the accompanying figures. It is noted that wherever practicable, similar or like reference numbers may be used in the figures and may indicate similar or like functionality. The figures depict embodiments for purposes of illustration only.

Embodiments relate to a driver for transmitting a signal to a receiver. In some embodiments, the driver transmits the signal through a transmission line and the receiver at a second side of the transmission line is tuned to a specific resistance value (e.g., a 50Ω resistance). As the frequency of a signal being transmitted by the driver increases, the time available for the transmitted signal to switch from one logic level to another logic level decreases. At high frequencies, due to the characteristics of the transmission line, the signal received by the receiver may not have enough time to switch between one logic level to another logic level before the signal is switched back to the first logic level.

The driver circuit includes a pull-up network and a pull-down network that temporarily reduces the output impedance of the driver circuit when an impending data transmission is detected. Moreover, the pull-up network and the pull-down network are adapted to cause the driver circuit to return to having a predetermined output impedance when the output data stream is static. The pull-up network of the driver circuit has a first pull-up transistor controlled by a data signal, a second pull-up transistor coupled between the first pull-up transistor and a first power supply voltage, and a third pull-up transistor coupled in parallel with the second pull-up transistor. To control the output impedance of the driver circuit, the third pull-up transistor is configured to turn on for at least one clock cycle responsive to a change in the logic level of the data signal being detected.

By adapting the output impedance of the driver circuit, the driver circuit improves the signal quality of data transmission by reducing the rise-time and the fall-time of the transmitted stream. Moreover, by reducing the rise-time and the fall-time of the transmitted stream, the driver circuit is capable of transmitting signals at a higher frequency.

Figure 1B:
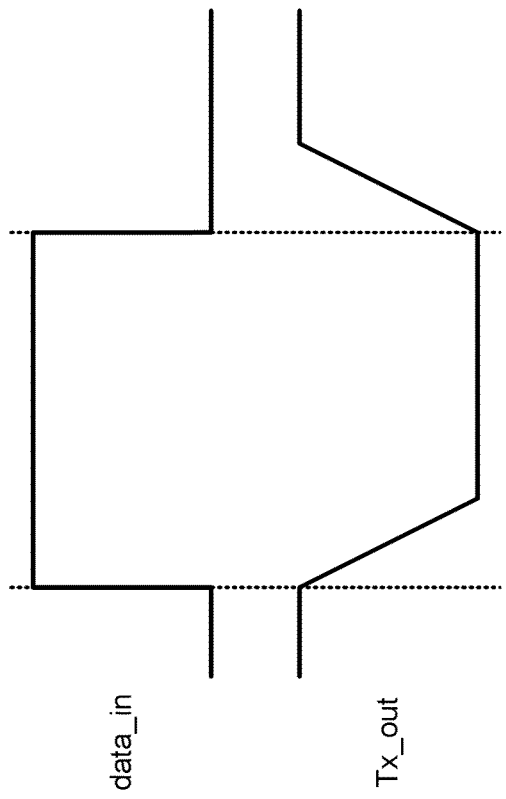
FIGS. 1B and 1C illustrate input and output signals for the driver of FIG. 1A at two different frequencies.
Figure 1C:
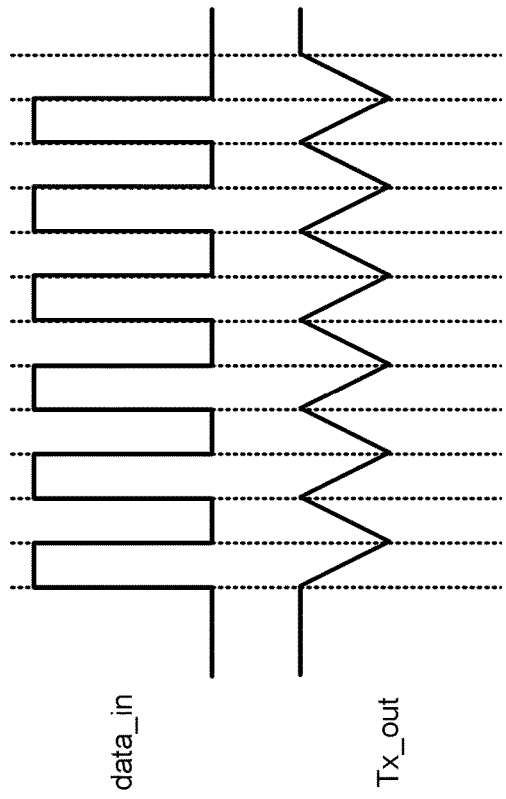
Figure 1A:
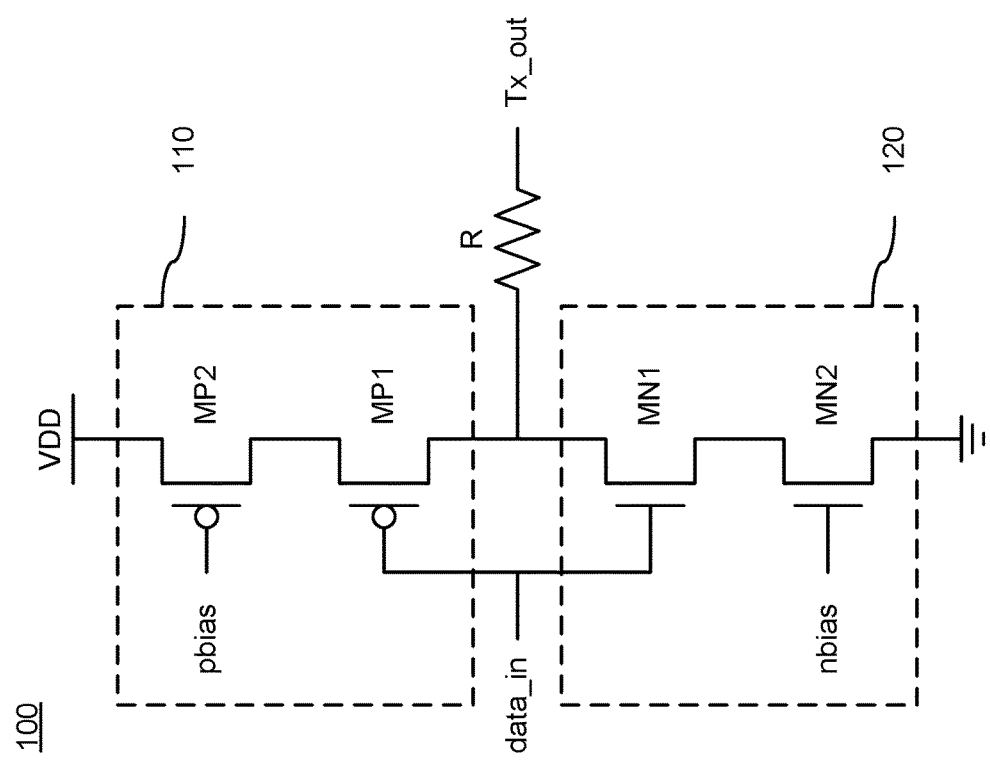
FIG. 1A illustrates a schematic view of a driver circuit, according to one embodiment.

FIG. 1A illustrates a schematic view of a driver circuit, according to one embodiment. The driver circuit 100 includes a pull-up network 110 and a pull-down network 120. When the input data data_in has a first logic level (e.g., low logic level), the pull-up network is turned on and the output Tx_out is pulled up to the first supply voltage VDD. Similarly, when the input data data_in has a second logic level (e.g., a high logic level), the pull-down network is turned on and the output Tx_out is pulled down to the second supply voltage GND or VSS.

The pull-up network includes a first pull-up transistor MP1 and a second pull-up transistor MP2. The pull-down network includes a first pull-down transistor MN1 and a second pull-down transistor MN2. The first pull-up transistor MP1 and the first pull-down transistor MN1 receive as a control signal, the input data signal data_in. Moreover, the second pull-up transistor MP2 receives as a control signal a first bias signal pbias, and the second pull-down transistor MN2 receives as a control signal a second bias signal nbias.

In some embodiments, the pull-up network 110 and the pull-down network 120 are tuned to have a specific impedance (e.g., 50Ω) when they are turned on. For instance, the size of the transistors and the bias voltage pbias and nbias are selected to control the resistance of the pull-up network 110 and the pull-down network 120. The pull-up resistance $R_{up}$ and the pull-down resistance $R_{down}$ are equal to $$R_{up} = R + R_{MP1} + R_{MP2} \quad (1)$$

$$R_{down} = R + R_{MN1} + R_{MN2} \quad (2)$$

Where $R_{MP1}$ is the on-resistance of the first pull-up transistor MP1, $R_{MP2}$ is the on-resistance of the second pull-up transistor MP2, $R_{MN1}$ is the on-resistance of the first pull-down transistor MN1, $R_{MN2}$ is the on-resistance of the second pull-down transistor MN2.

FIGS. 1B and 1C illustrate input and output signals for the driver of FIG. 1A at two different frequencies. The input signal of FIG. 1B has a frequency lower than the input signal of FIG. 1C. As shown in FIG. 1B, when the input data signal data_in transitions from a first logic level to a second logic level, the output signal Tx_out switches from the first logic level to the second logic level at a rate that is based on the value of the pull-down resistance $R_{down}$ and the value of parasitic capacitances in the driver circuit and the transmission line. Similarly, when the input data signal data_in transitions from the second logic level to the first logic level, the output signal Tx_out switches from the second logic level to the second logic level at a rate that is based on the value of the pull-up resistance $R_{up}$ and the value of parasitic capacitances in the driver circuit and the transmission line.

As shown in FIG. 1C, if the frequency of the input signal is faster than the time that the output signal takes to fully transitions from the second logic level to the first logic level, or from the first logic level to the second logic level, the output signal Tx_out becomes clipped.

Figure 2A:
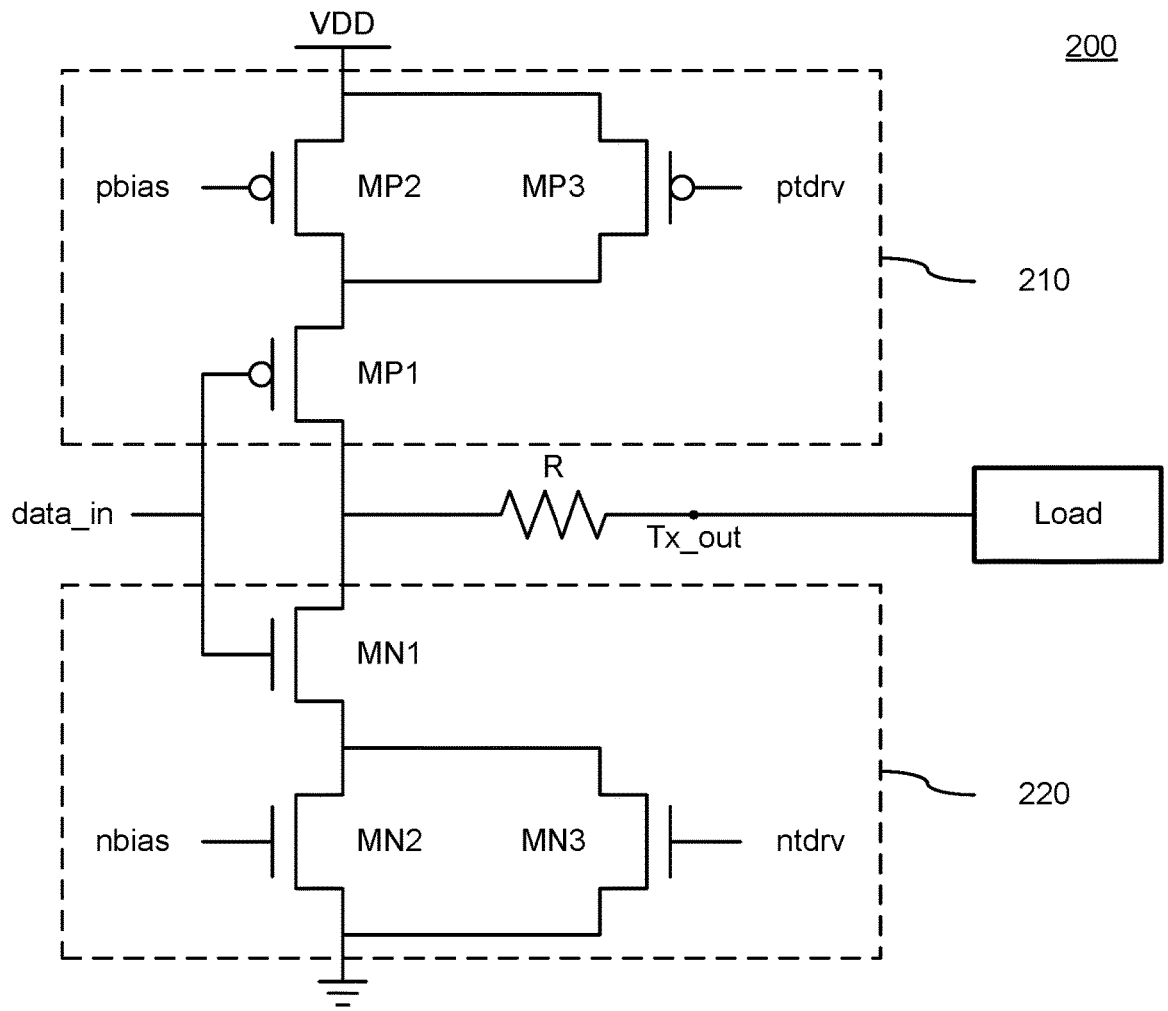
FIG. 2A illustrates a schematic view of a driver circuit, according to another embodiment.

FIG. 2A illustrates a schematic view of a driver circuit, according to another embodiment. The driver circuit 200 of FIG. 2A has a third pull-up transistor MP3 connected in parallel with the second pull-up transistor MP2 in the pull-up network 210. Moreover, driver circuit 200 of FIG. 2A has a third pull-down transistor MN3 connected in parallel with the second pull-down transistor MN2 in the pull-down network 220. The third pull-up transistor MP3 is controlled based on a first control signal ptdrv. That is, the third pull-up transistor MP3 is configured to turn on or off based on the value of the first control signal ptdrv. Moreover, the third pull-down transistor MN3 is controlled based on a second control signal ntdrv. That is, the third pull-down transistor MN3 is configured to turn on or off based on the value of the second control signal ntdrv. In some embodiments, when the third pull-up transistor MP3 and the third pull-down transistor MN3 are turned on, the pull-up resistance $R_{up}'$ and the pull-down resistance $R_{down}'$ are equal to $$R'_{up} = R + R_{MP1} + \frac{R_{MP2} \cdot R_{MP3}}{R_{MP2} + R_{MP3}} \quad (1)$$

$$R'_{down} = R + R_{MN1} + \frac{R_{MN2} \cdot R_{MN3}}{R_{MN2} + R_{MN3}} \quad (2)$$

Where $R_{MP3}$ is the on-resistance of the third pull-up transistor MP3, and $R_{MN3}$ is the on-resistance of the third pull-down transistor.

As such, when the third pull-up transistor MP3 is turned on, the resistance of the pull-up network is reduced, allowing the pull-up network to change the output voltage Tx_out faster. In some embodiments, the third pull-up transistor MP3 is designed to have an on-resistance in the same order of magnitude as the second pull-up transistor MP2. For example, the third pull-up transistor MP3 is selected to have the same on-resistance as the second pull-up transistor MP2. Moreover, when the third pull-down transistor MN3 is turned on, the resistance of the pull-down network is reduced, allowing the pull-down network to change the output voltage Tx_out faster. In some embodiments, the third pull-down transistor MN3 is designed to have an on-resistance in the same order of magnitude as the second pull-down transistor MN2. For example, the third pull-down transistor MN3 is selected to have the same on-resistance as the second pull-down transistor MN2. In some embodiments, since the pull-up network 210 and the pull-down network 220 only change the voltage value of the output Tx_out when the data_in signal changes, the third pull-up transistor MP3 and the third pull-down transistor MN3 are controlled to turn on for a clock cycle after a switch in the voltage value of the data_in signal is detected. That is, the third pull-up transistor MP3 and the third pull-down transistor MN3 are controlled to turn on during clock cycles when the input data signal data_in experiences a transition, and are controlled to turn off during clock cycles when the input data signal data_in remains constant.

By placing the third pull-up transistor MP3 and the third pull-down transistor MN3 in parallel with the second pull-up transistor MP2 and the second pull-down transistor MN2, respectively, the impact of the parasitic capacitances of the third pull-up transistor MP3 and the third pull-down transistor MN3 in the output of the driver is reduced. That is, by placing the third pull-up transistor MP3 and the third pull-down transistor MN3 further away from the output node of the driver 200, the impact of the parasitic capacitances of those transistors on the output is reduced.

In some embodiments, the third pull-up transistor MP3 and the third pull-down transistor MN3 equalizes the effect of a load capacitance (e.g., the parasitic capacitance of a transmission line or of a receiver circuit) by reducing the pull-up and pull-down resistance of the driver circuit 200 and boosting the amplitude of the output signal Tx_out for a short period of time after the output signal Tx_out transitions.

Figure 2B:
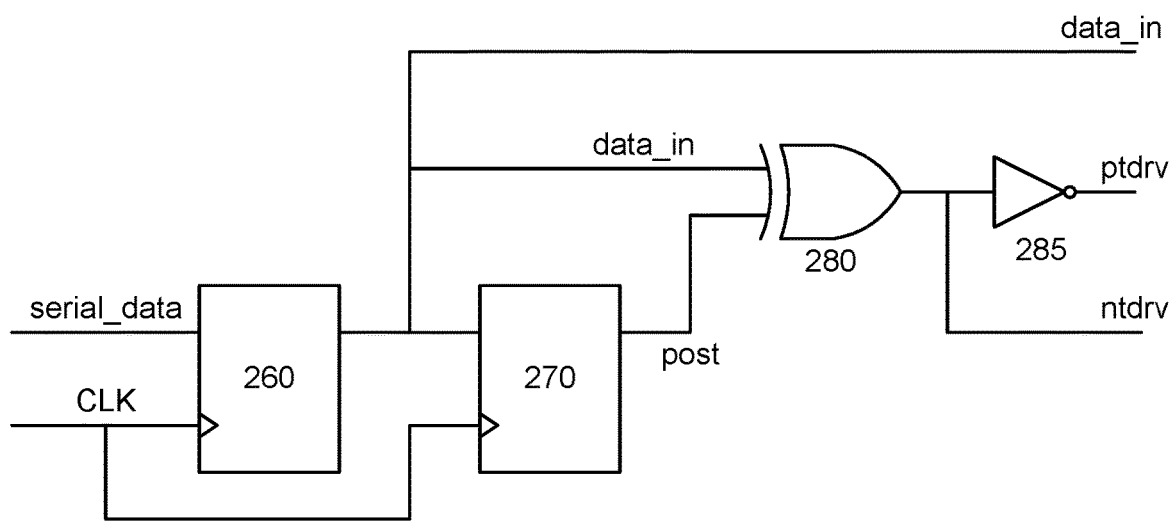
FIG. 2B illustrates a schematic view of a control circuit for generating the first control signal ptdrv and the second control signal ntdrv, according to one embodiment.

FIG. 2B illustrates a schematic view of a control circuit for generating the first control signal ptdrv and the second control signal ntdrv, according to one embodiment. The control circuit 250 includes a first flip-flop 260 that receives an input stream serial_data and stores the received input stream based on a clock CLK. The first flip-flop 260 outputs the data signal data_in. In some embodiments, the data signal data_in is the input stream serial_data delayed by one clock cycle. Moreover, the control circuit 250 includes a second flip-flop 270 that stores the data signal data_in based on the clock CLK. The second flip-flop 270 outputs the post signal. In some embodiments, the post signal is the data signal data_in delayed by one clock cycle. Moreover, since the data signal data_in is the input stream serial_data delayed by one clock cycle, the post signal is the input stream serial_data delayed by two clock cycles.

The control circuit 250 includes a logic gate 280 that generates a control signal based on the data_in signal and the post signal. The logic gate 280 output a signal having a first logic level when the data_in signal and the post signal have the same logic level, and output a signal having a second logic level, different than the first logic level, when the data_in signal and the post signal have different logic levels. Since the post signal is the data_in signal delayed by one clock cycle, the logic gate 280 generates a signal having the second logic level when data_in signal switches. In some embodiments, the logic gate 280 is an exclusive-OR (XOR) gate and the control signal generated by the logic gate 280 is the second control signal ntdrv. Moreover, the control circuit 250 includes an inverter 285 that inverts the second control signal ntdrv to generate the first control signal ptdrv.

Figure 3A:
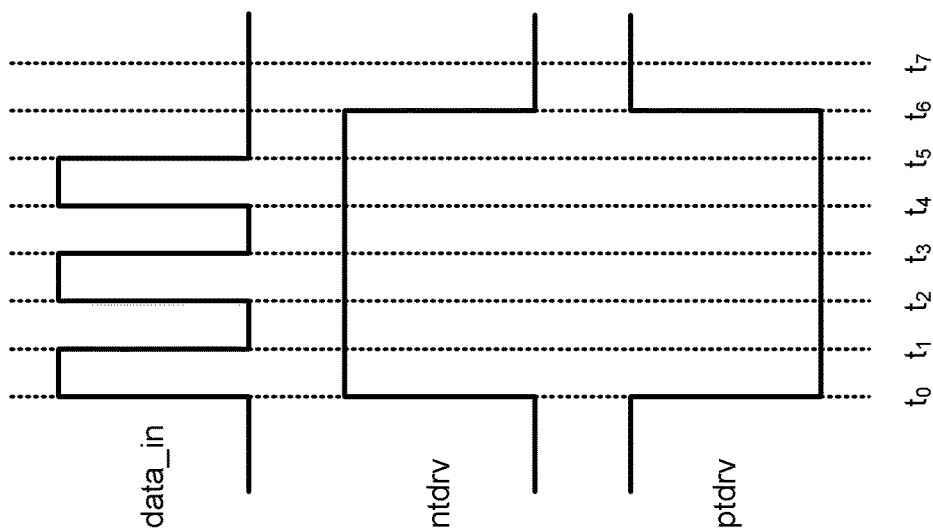
FIG. 3A illustrates a timing diagram of the input data signal data_in, the first control signal ptdrv, and the second control signal ntdrv, for an input data signal data_in changing with a first frequency, according to one embodiment.

FIG. 3A illustrates a timing diagram of the input data signal data_in, the first control signal ptdrv, and the second control signal ntdrv, for an input data signal data_in changing with a first frequency, according to one embodiment. In particular, the data_in signal switches from a low logic level to a high logic level and stays in the high logic level for 6 clock cycles.

As shown in the timing diagram, when the data_in signal switches (i.e., when the data_in signal transitions from a low logic level to a high logic level, or from a high logic level to a low logic level), the ntdrv signal and the ptdrv signal transition to an active value. In some embodiments, the ntdrv signal has a low logic level when the ntdrv signal is inactive, and has a high logic level when the ntdrv signal in active. Conversely, the ptdrv signal has a high logic level when the ptdrv signal is inactive, and has a low logic level when the ptdrv signal is active. In some embodiments, the ptdrv signal is the inverse of the ntdrv signal.

Since the data_in signal switches at a slow frequency, the ntdrv signal and ptdrv signal are returned to an inactive state after one clock cycle after the data_in signal switches logic levels. In other words, the data_in signal transitions from the low logic level to the high logic level at time $t_0$. As such, the ntdrv signal and the ptdrv signal transition to an active state at time $t_0$ and transition back to an inactive state at time $t_1$. Moreover, at time $t_6$, the data_in signal transitions from the high logic level to the low logic level. As such, the ntdrv signal and the ptdrv signal transition to an active state at time $t_6$ and transition back to an inactive state at time $t_7$.

Figure 3B:
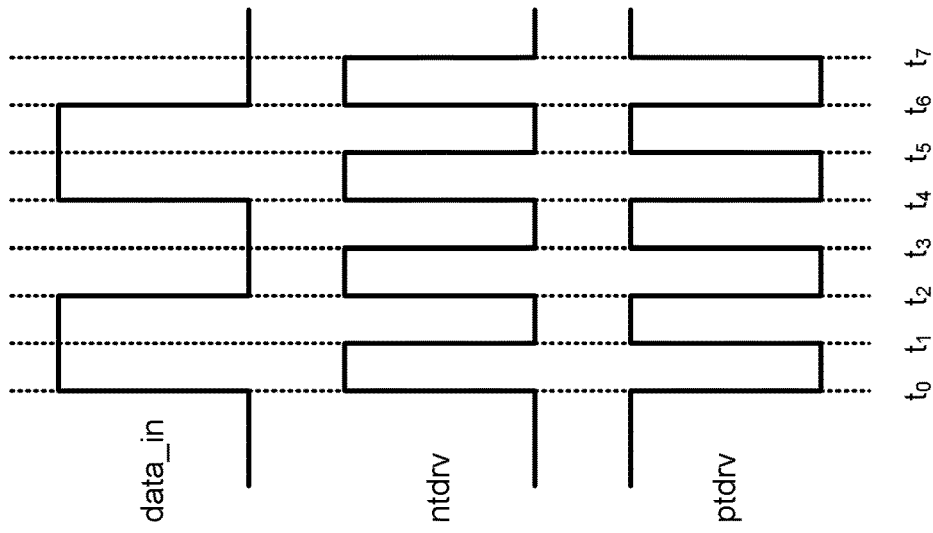
FIG. 3B illustrates a timing diagram of the input data signal data_in, the first control signal ptdrv, and the second control signal ntdrv, for an input data signal data_in changing with a second frequency, faster than the first frequency, according to one embodiment.

FIG. 3B illustrates a timing diagram of the input data signal data_in, the first control signal ptdrv, and the second control signal ntdrv, for an input data signal data_in changing with a second frequency, faster than the first frequency, according to one embodiment. In particular, the data_in signal of FIG. 3B switches every two clock cycles. That is, the data_in signal of FIG. 3B switches from a low logic level to a high logic level at times $t_0$ and $t_4$, and from the high logic level back to the low logic level at times $t_2$ and $t_6$.

As shown in the timing diagram, the ntdrv signal and the ptdrv signal transition to an active value at times $t_0$, $t_2$, $t_4$, and $t_6$. Moreover, since the data_in signal stays at a logic level for multiple clock cycles, the ntdrv signal and the ptdrv signal return to the inactive state after one cycle of being in the active state. That is, ntdrv signal and the ptdrv signal transition to an inactive value at times $t_1$, $t_3$, $t_5$, and $t_7$.

Figure 3C:
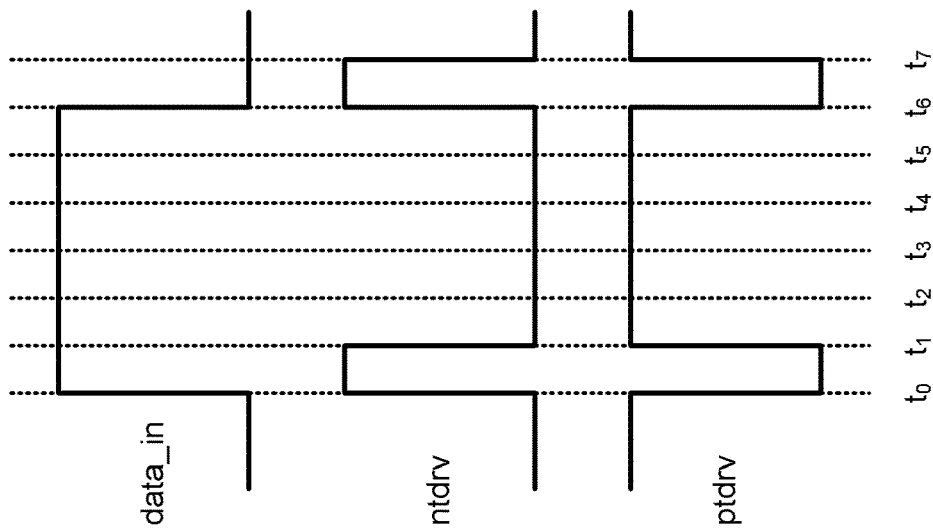
FIG. 3C illustrates a timing diagram of the input data signal data_in, the first control signal ptdrv, and the second control signal ntdrv, for an input data signal data_in changing with a first frequency, faster than the second frequency, according to one embodiment.

FIG. 3C illustrates a timing diagram of the input data signal data_in, the first control signal ptdrv, and the second control signal ntdrv, for an input data signal data_in changing with a first frequency, faster than the second frequency, according to one embodiment. In particular, the data_in signal switches at every clock cycle. Since the data_in signal switches every clock cycle, the ntdrv signal and the ptdrv signal is kept at the active state until the switching frequency of the data_in signal decreases. In particular, in the example of FIG. 3C, the ntdrv signal and the ptdrv signal are kept at the active state from time $t_0$ until time $t_6$.

By activating the ntdrv signal and the ptdrv signal during clock cycles when the data_in signal transitions, the pull-up and pull-down resistances of the driver circuit 200 is reduced, allowing the driver circuit 200 to transition the output signal at a faster rate. Moreover, by disabling the ntdrv signal and the ptdrv signal during clock cycles when the data_in signal is not transitioning, power consumption is reduced. Moreover, turning off the third pull-up transistor MP3 and the third pull-down transistor MN3 during clock cycles when the data_in signal is not transitioning, the resistance of the driver can be controlled to have a predetermined value (e.g., by tuning the pbias and the nbias voltages), improving the stability of the overall system.

Additional Configuration Consideration

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of ordinary skill in the art will appreciate still additional alternative structural and functional designs through the disclosed principles of the embodiments. Thus, while particular embodiments and applications have been illustrated and described, it is to be understood that the embodiments are not limited to the precise construction and components disclosed herein and that various modifications, changes and variations which will be apparent to those skilled in the art may be made in the arrangement, operation and details of the method and apparatus disclosed herein without departing from the spirit and scope as defined in the appended claims.

What is claimed is:

1. A driver comprising, comprising:
a control circuit having a first input terminal for receiving an input data signal, a second input terminal for receiving a clock signal, wherein the control circuit is configured to delay the input data signal by at least one clock cycle, and generate a control signal having a first logic level in response to the input data signal and the delayed input data signal having a same logic level, and a second logic level in response to the input data signal and the delayed input data signal having different logic levels; and
a pull-up network having:
a first pull-up transistor controlled by the input data signal,
a second pull-up transistor coupled between the first pull-up transistor and a first power supply voltage; and
a third pull-up transistor, the third pull-up transistor coupled in parallel with the second pull-up transistor, a gate terminal of the third pull-up transistor coupled to an output terminal of the control circuit providing the control signal, the control signal configured to turn on the third pull-up transistor responsive to the input data signal and the delayed input data signal having different logic levels.

2. The driver of claim 1, further comprising:
a pull-down network having:
a first pull-down transistor controlled by the input data signal;
a second pull-down transistor coupled between the first pull-down transistor and a second power supply voltage; and
a third pull-down transistor, the third pull-down transistor coupled in parallel with the second pull-down transistor, a gate terminal of the third pull-down transistor coupled to a second output terminal of the control circuit providing a second control signal, the second control signal configured to turn on the third pull-down transistor responsive to the input data signal and the delayed input data signal having different logic levels.

3. The driver of claim 2, wherein the first, second and third pull-up transistors are p-type transistors, and wherein the first, second and third pull-down transistors are n-type transistors.

4. The driver of claim 1, wherein the third pull-up transistor is configured to reduce a pull-up resistance of the pull-up network for at least one clock cycle in response to the input data signal switching from one voltage level to another voltage level.

5. The driver of claim 1, wherein the control circuit comprises:
a flip-flop receiving the input data signal, and
a logic gate receiving as inputs the input data signal and an output of the flip-flop, the logic gate configured to generate the control signal having the first logic level in response to the input data signal and the output of the flip-flop having the same logic level, and the second logic level in response to the input data signal and the output of the flip-flop having different logic levels.

6. The driver of claim 5, wherein the logic gate is an exclusive-or (XOR) gate.

7. The driver of claim 6, further comprising an inverter having an input coupled to an output of the XOR gate, an output of the inverter coupled to a gate of the third pull-up transistor.

8. A method for controlling a driver circuit comprising:
receiving, at a control circuit, an input data signal and a clock signal;
generating a control signal based on the data signal and the clock signal comprising:
delaying the input data signal by at least one clock cycle, and
generating the control signal having a first logic level in response to the input data signal and the delayed input data signal having a same logic level, and a second logic level in response to the input data signal and the delayed input data signal having different logic levels; and
controlling a third pull-up transistor of a pull-up network based on the control signal, the third pull-up transistor in parallel with a second pull-up transistor, the third pull-up transistor coupled between a first pull-up transistor and a first power supply voltage, comprising:
turning on the third pull-up transistor responsive to the input data signal and the delayed input data signal having different logic levels.

9. The method of claim 8, wherein increasing the resistance of the pull-up network comprises:
increasing the resistance of the pull-up network to a predetermined value after the third pull-up transistor has been turned on for one clock cycle.

10. The method of claim 9, wherein increasing the resistance of the pull-up network to the predetermined value comprises turning off the third pull-up transistor.

11. The method of claim 8, further comprising:
controlling a third pull-down transistor of a pull-down network, the third pull-down transistor in parallel with a second pull-down transistor, the third pull-down transistor coupled in between a first pull-down transistor and a second power supply voltage, comprising:
turning on the third pull-down transistor responsive to the input data signal and the delayed input data signal having different logic levels.

12. The method of claim 8, wherein the first, second and third pull-up transistors are p-type transistors, and wherein the first, second and third pull-down transistors are n-type transistors.

13. The method of claim 8, wherein comparing the input data signal with the delayed input data signal comprises using an exclusive-or (XOR) gate.

14. A non-transitory computer readable storage medium storing a design of a driver circuit, the design of the driver circuit comprising:
   a control circuit having a first input terminal for receiving an input data signal, a second input terminal for receiving a clock signal wherein the control circuit is configured to delay the input data signal by at least one clock cycle, and generate the control signal having a first logic level in response to the input data signal and the delayed input data signal having a same logic level, and a second logic level in response to the input data signal and the delayed input data signal having different logic levels; and
   a pull-up network having:
      a first pull-up transistor controlled by a input data signal;
      a second pull-up transistor coupled between the first pull-up transistor and a first power supply voltage; and
      a third pull-up transistor, the third pull-up transistor coupled in parallel with the second pull-up transistor, a gate terminal of the third pull-up transistor coupled to an output terminal of the control circuit providing the control signal, the control signal configured to turn on the third pull-up transistor responsive to the input data signal and the delayed input data signal having different logic levels.

15. The non-transitory computer readable storage medium of claim 14, wherein the design of the driver circuit further comprises:
   a pull-down network having:
      a first pull-down transistor controlled by the input data signal,
      a second pull-down transistor coupled between the first pull-down transistor and a second power supply voltage; and
      a third pull-down transistor, the third pull-down transistor coupled in parallel with the second pull-down transistor, a gate terminal of the third pull-down transistor coupled to a second output terminal of the control circuit providing a second control signal, the second control signal configured to turn on the third pull-down transistor responsive to the input data signal and the delayed input data signal having different logic levels.

16. The non-transitory computer readable storage medium of claim 15, wherein the first, second and third pull-up transistors are p-type transistors, and wherein the first, second and third pull-down transistors are n-type transistors.

17. The non-transitory computer readable storage medium of claim 14, wherein the third pull-up transistor is configured to reduce a pull-up resistance of the pull-up network for one clock cycle in response to the input data signal switching from one voltage level to another voltage level.

18. The non-transitory computer readable storage medium of claim 14, wherein the design of the control circuit further comprises:
   a flip-flop receiving the input data signal, and
   a logic gate receiving as inputs the input data signal and an output of the flip-flop, the logic gate configured to generate the control signal having the first logic level in response to the input data signal and the output of the flip-flop having the same logic level, and the second logic level in response to the input data signal and the output of the flip-flop having different logic levels.

19. The non-transitory computer readable storage medium of claim 18, wherein the logic gate is an exclusive-or (XOR) gate.

* * * * *